US009356220B2

(12) United States Patent
Gilbert et al.

(10) Patent No.: US 9,356,220 B2
(45) Date of Patent: *May 31, 2016

(54) EXTREMELY LOW RESISTANCE COMPOSITION AND METHODS FOR CREATING SAME

(71) Applicant: Ambature, Inc., Scottsdale, AZ (US)

(72) Inventors: Douglas J. Gilbert, Flagstaff, AZ (US); Timothy S. Cale, Phoenix, AZ (US)

(73) Assignee: Ambature, Inc., Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/450,308

(22) Filed: Aug. 4, 2014

(65) Prior Publication Data

US 2015/0188020 A1    Jul. 2, 2015

Related U.S. Application Data

(63) Continuation of application No. 13/495,523, filed on Jun. 13, 2012, now Pat. No. 8,796,181, which is a continuation of application No. 12/794,688, filed on Jun. 4, 2010, now Pat. No. 8,211,833.

(51) Int. Cl.
*H01L 39/24* (2006.01)
*H01L 39/12* (2006.01)

(52) U.S. Cl.
CPC ............ *H01L 39/128* (2013.01); *H01L 39/126* (2013.01); *H01L 39/2419* (2013.01); *Y10T 156/10* (2015.01); *Y10T 428/12847* (2015.01); *Y10T 428/24174* (2015.01); *Y10T 428/31678* (2015.04)

(58) Field of Classification Search
CPC ................................. H01L 39/24; H01L 39/12
USPC ......... 505/100, 150, 234, 236–238, 470, 473; 428/472, 698, 702, 930
See application file for complete search history.

(56) References Cited

U.S. PATENT DOCUMENTS

| | | | | |
|---|---|---|---|---|
| 8,211,833 B2 * | 7/2012 | Gilbert et al. | ................. | 505/236 |
| 8,404,620 B2 * | 3/2013 | Gilbert et al. | ................. | 505/121 |
| 8,796,181 B2 * | 8/2014 | Gilbert et al. | ................. | 505/236 |

* cited by examiner

*Primary Examiner* — Paul Wartalowicz
(74) *Attorney, Agent, or Firm* — Toering Patents PLLC

(57) ABSTRACT

The invention pertains to creating new extremely low resistance ("ELR") materials, which may include high temperature superconducting ("HTS") materials. In some implementations of the invention, an ELR material may be modified by depositing a layer of modifying material unto the ELR material to form a modified ELR material. The modified ELR material has improved operational characteristics over the ELR material alone. Such operational characteristics may include operating at increased temperatures or carrying additional electrical charge or other operational characteristics. In some implementations of the invention, the ELR material is a cuprate-perovskite, such as, but not limited to YBCO. In some implementations of the invention, the modifying material is a conductive material that bonds easily to oxygen, such as, but not limited to, chromium.

17 Claims, 17 Drawing Sheets

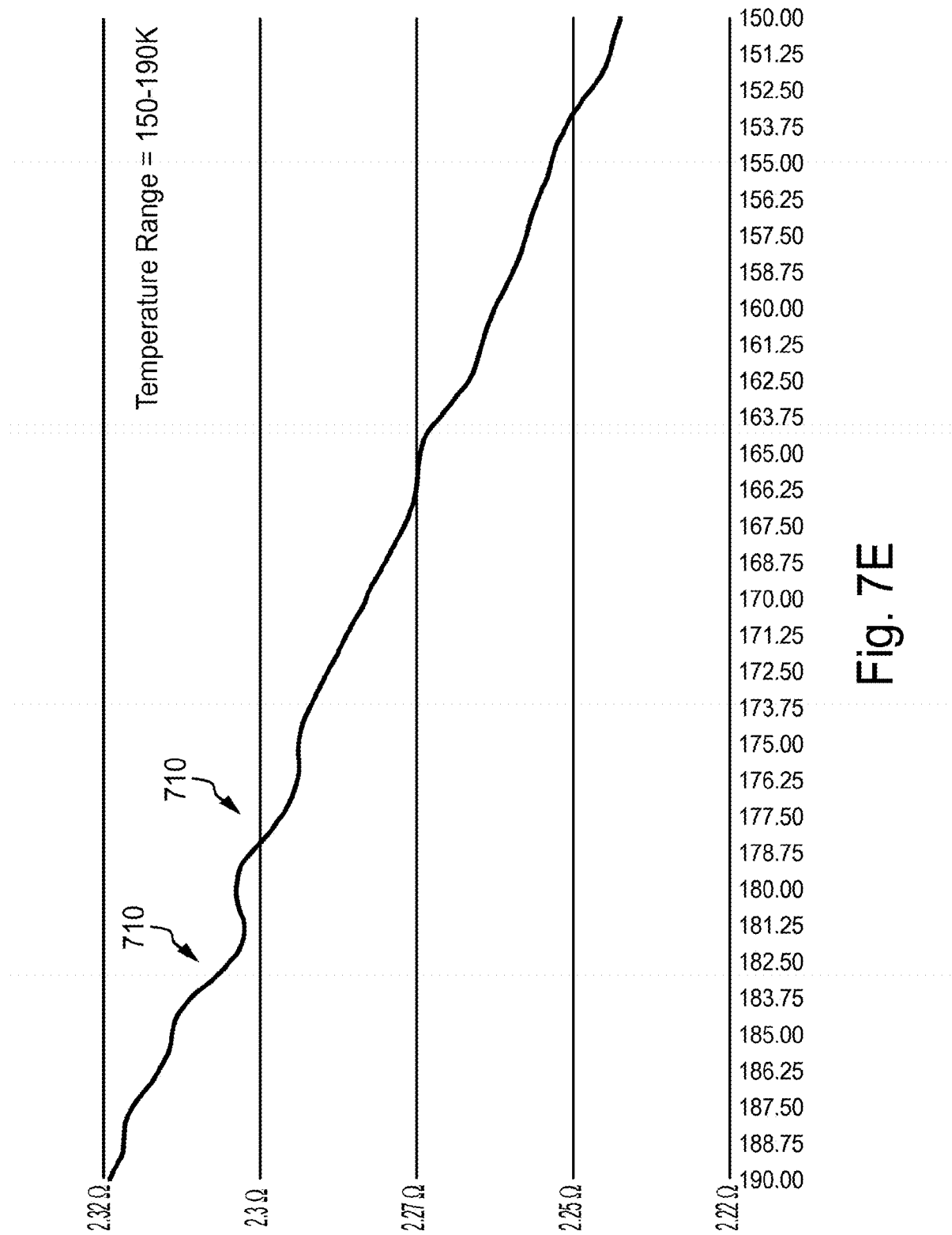

EXTREMELY LOW RESISTANCE COMPOSITION AND METHODS FOR CREATING SAME

CROSS-REFERENCE TO RELATED APPLICATIONS

This application is a continuation application of U.S. application Ser. No. 13/495,523, which was filed on Jun. 13, 2012, now U.S. Pat. No. 8,796,181; which in turn is a continuation of U.S. application Ser. No. 12/794,688, which was filed on Jun. 4, 2010, now U.S. Pat. No. 8,211,833. The contents of each of the foregoing applications are incorporated herein by reference in their entirety.

FIELD OF THE INVENTION

The invention is generally related to materials with extremely low resistance ("ELR materials") at high temperatures, and more particularly to modifying ELR materials, including various existing high temperature superconducting ("HTS") materials, to operate at higher temperatures and/or with increased charge carrying capacity.

BACKGROUND OF THE INVENTION

Various HTS materials exist. Ongoing research attempts to achieve new HTS materials with improved operating characteristics over existing HTS materials. Such operating characteristics may include, but are not limited to, operating in a superconducting state at higher temperatures, operating with increased charge carrying capacity at the same (or higher) temperatures, and/or other operating characteristics.

Scientists have theorized a possible existence of a "perfect conductor," or material that exhibits extremely low resistance (similar to the resistance exhibited by superconducting materials, including superconducting HTS materials, in their superconducting state), but that may not necessarily demonstrate all the other conventionally accepted characteristics of a superconducting material.

Notwithstanding their name, conventional HTS materials still operate at very low temperatures. In fact, most commonly used HTS materials still require use of liquid nitrogen cooling systems. Such cooling systems increase costs and prohibit widespread commercial and consumer application of such materials.

What are needed are improved ELR materials that operate at higher temperatures and/or with increased charge carrying capacity.

BRIEF DESCRIPTION OF THE DRAWINGS

The accompanying drawings, which are included to provide a further understanding of the invention and are incorporated in and constitute a part of this specification, illustrate various exemplary implementations of the invention and together with the detailed description serve to explain various principles and/or aspects of one or more embodiments of the invention.

FIGS. 7A-7G illustrate test results demonstrating various operational characteristics of a modified ELR material according to various implementations of the invention.

SUMMARY OF THE INVENTION

Figure 1:
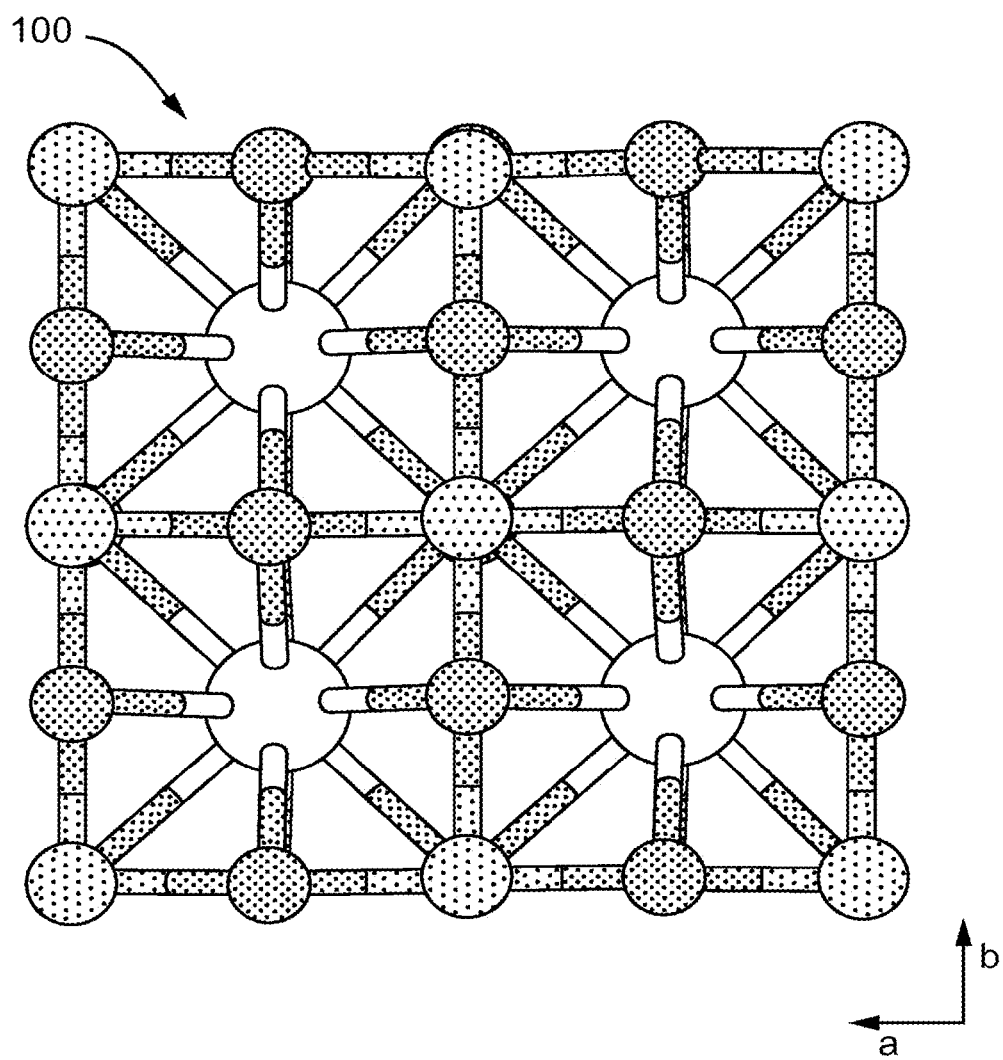
FIG. 1 illustrates a crystalline structure of an exemplary ELR material as viewed from a first perspective.

Generally speaking, various implementations of the invention relate to new ELR materials and/or processes for creating new ELR materials. In some implementations of the invention, existing ELR materials, including existing HTS materials, are modified to create modified ELR materials with improved operating characteristics. These operating characteristics may include, but are not limited to, operating in an extremely low resistance state at increased temperatures, operating with increased charge carrying capacity at the same (or higher) temperatures, and/or other improved operating characteristics. With regard to HTS materials, these operating characteristics may correspondingly include, but are not limited to, operating in a superconducting state at increased temperatures, operating with increased charge carrying capacity at the same (or higher) temperatures, and/or other improved operating characteristics.

In some implementations, a modifying material is layered onto an ELR material to form a modified ELR material that operates at a higher temperature than that of the ELR material without a modifying material. Exemplary ELR materials may be selected from a family of HTS materials known as cuprate-perovskite ceramic materials. Modifying materials may be selected from any one or combination of chromium, rhodium, beryllium, gallium, selenium, and/or vanadium.

In some implementations of the invention, a composition comprises an ELR material and a modifying material bonded to the ELR material.

In some implementations of the invention, a composition comprises an extremely low resistance material, and a modifying material bonded to the extremely low resistance material, where the composition has improved operating characteristics over the extremely low resistance material.

In some implementations of the invention, a composition comprises an extremely low resistance material, and a modifying material bonded to the extremely low resistance material such that the composition operates in an ELR state at a temperature greater than that of the extremely low resistance material alone or without the modifying material.

In some implementations of the invention, a method comprises bonding a modifying material to an extremely low resistance material to form a modified extremely low resistance material, where the modified extremely low resistance material operates at a temperature greater than that of the extremely low resistance material alone or without the modifying material.

In some implementations of the invention, a method for creating an extremely low resistance material comprises depositing a modifying material onto an initial extremely low resistance material thereby creating the extremely low resistance material, wherein the extremely low resistance material has improved operating characteristics over the initial extremely low resistance material alone or without the modifying material.

In some implementations of the invention, a method comprises bonding a modifying material to a superconducting material to form a modified superconducting material such that the modified superconducting material operates in superconducting state at a temperature greater than that of the superconducting material alone or without the modifying material.

In some implementations of the invention, a composition comprises a first layer comprising an extremely low resistance material, and a second layer comprising a modifying material, where the second layer is bonded to the first layer. In some implementations of the invention, a composition comprises a first layer comprising an extremely low resistance material, a second layer comprising a modifying material, where the second layer is bonded to the first layer, a third layer comprising the extremely low resistance material, and a fourth layer of the modifying material, where the third layer is bonded to the fourth layer. In some implementations of the invention, the second layer is deposited onto the first layer. In some implementations of the invention, the first layer is deposited onto the second layer. In some implementations of the invention, the extremely low resistance material of the first layer is formed on the second layer. In some implementations of the invention, the first layer has a thickness of at least a single crystalline unit cell of the extremely low resistance material. In some implementations of the invention, the first layer has a thickness of several crystalline unit cells of the extremely low resistance material. In some implementations of the invention, the second layer has a thickness of at least a single atom of the modifying material. In some implementations of the invention, the second layer has a thickness of several atoms of the modifying material.

In some implementations of the invention, a composition comprises a first layer comprising YBCO, and a second layer comprising a modifying material, wherein the modifying material of the second layer is bonded to the YBCO of the first layer, wherein the modifying material is an element selected as any one or more of the group consisting of chromium, rhodium, beryllium, gallium, selenium, and vanadium. In some implementations of the invention, the modifying material of the second layer is bonded to a face of the YBCO of the first layer, where the face is not substantially perpendicular to a c-axis of the YBCO. In some implementations of the invention, the modifying material of the second layer is bonded to a face of the YBCO of the first layer, where the face is substantially perpendicular to any line in an a-b plane of the YBCO. In some implementations of the invention, the modifying material of the second layer is bonded to a face of the YBCO of the first layer, where the face is substantially perpendicular to a b-axis of the YBCO. In some implementations of the invention, the modifying material of the second layer is bonded to a face of the YBCO of the first layer, where the face is substantially perpendicular to an a-axis of the YBCO. In some implementations of the invention, the modifying material of the second layer is bonded to a face of the YBCO of the first layer, where the face is substantially parallel to the c-axis.

In any of the aforementioned or following implementations of the invention, the ELR material comprises a HTS material. In any of the aforementioned or following implementations of the invention, the ELR material comprises an HTS perovskite material. In any of the aforementioned or following implementations of the invention, the HTS perovskite material may be selected from the groups generically referred to as LaBaCuO, LSCO, YBCO, BSCCO, TBCCO, $HgBa_2Ca_2Cu_3O_x$, or other HTS perovskite materials. In any of the aforementioned or following implementations of the invention, the modifying materials may be a conductive material that bonds easily with oxygen. In any of the aforementioned or following implementations of the invention, the modifying materials may be any one or combination of chromium, rhodium, beryllium, gallium, selenium, and/or vanadium. In any of the aforementioned or following implementations of the invention, various combinations of the ELR materials and the modifying materials may be used. In any of the aforementioned or following implementations of the invention, the ELR material is YBCO and the modifying material is chromium.

In any of the aforementioned or following implementations of the invention, the composition operates at a higher temperature than the extremely low resistance material alone or without the modifying material. In any of the aforementioned or following implementations of the invention, the composition demonstrates extremely low resistance at a higher temperature than that of the extremely low resistance material alone or without the modifying material. In any of the aforementioned or following implementations of the invention, the composition transitions from a non-ELR state to an ELR state at a temperature higher than that of the extremely low resistance material alone or without the modifying material. In any of the aforementioned or following implementations of the invention, the composition has a transition temperature greater than that of the extremely low resistance material alone or without the modifying material. In any of the aforementioned or following implementations of the invention, the composition carries a greater amount of current in an ELR state than that carried by the extremely low resistance material alone or without the modifying material.

In any of the aforementioned or following implementations, the composition operates in an extremely low resistance state at a higher temperature than the extremely low resistance material alone or without the modifying material. In any of the aforementioned or following implementations, the composition operates in an extremely low resistance state at temperatures greater than 100K. In any of the aforementioned or following implementations, the composition operates in an extremely low resistance state at temperatures greater than 110K. In any of the aforementioned or following implementations, the composition operates in an extremely low resistance state at temperatures greater than 120K. In any of the aforementioned or following implementations, the composition operates in an extremely low resistance state at temperatures greater than 130K. In any of the aforementioned or following implementations, the composition operates in an extremely low resistance state at temperatures greater than 140K. In any of the aforementioned or following implementations, the composition operates in an extremely low resistance state at temperatures greater than 150K. In any of the aforementioned or following implementations, the composition operates in an extremely low resistance state at temperatures greater than 160K. In any of the aforementioned or following implementations, the composition operates in an extremely low resistance state at temperatures greater than 170K. In any of the aforementioned or following implementations, the composition operates in an extremely low resistance state at temperatures greater than 180K. In any of the aforementioned or following implementations, the composition operates in an extremely low resistance state at temperatures greater than 190K. In any of the aforementioned or following implementations, the composition operates in an extremely low resistance state at temperatures greater than 200K. In any of the aforementioned or following implementations, the composition operates in an extremely low resistance state at temperatures greater than 210K. In any of the aforementioned or following implementations, the composition operates in an extremely low resistance state at temperatures greater than 220K. In any of the aforementioned or following implementations, the composition operates in an extremely low resistance state at temperatures greater than 230K. In any of the aforementioned or following implementations, the composition operates in an extremely low resistance state at temperatures greater than 240K. In any of the aforementioned or following implementations, the composition operates in an extremely low resistance state at temperatures greater than 250K. In any of the aforementioned or following implementations, the composition operates in an extremely low resistance state at temperatures greater than 260K. In any of the aforementioned or following implementations, the composition operates in an extremely low resistance state at temperatures greater than 270K. In any of the aforementioned or following implementations, the composition operates in an extremely low resistance state at temperatures greater than 280K. In any of the aforementioned or following implementations, the composition operates in an extremely low resistance state at temperatures greater than 290K. In any of the aforementioned or following implementations, the composition operates in an extremely low resistance state at temperatures greater than 300K. In any of the aforementioned or following implementations, the composition operates in an extremely low resistance state at temperatures greater than 310K.

In any of the aforementioned or following implementations where the ELR material is YBCO, the composition has improved operating characteristics over those of YBCO alone or without the modifying material. In any of the aforementioned or following implementations where the ELR material is YBCO, the composition operates at a higher temperature than that of YBCO alone or without the modifying material. In any of the aforementioned or following implementations where the ELR material is YBCO, the composition demonstrates extremely low resistance at a higher temperature than that of YBCO alone or without the modifying material. In any of the aforementioned or following implementations where the ELR material is YBCO, the composition transitions from a non-ELR state to an ELR state at a temperature higher than that of YBCO alone or without the modifying material. In any of the aforementioned or following implementations where the ELR material is YBCO, the composition has a transition temperature greater than that of YBCO alone or without the modifying material. In any of the aforementioned or following implementations where the ELR material is YBCO, the composition carries a greater amount of current in an ELR state than that carried by YBCO in its ELR state alone or without the modifying material.

In some implementations of the invention, a product or composition is produced by any of the aforementioned methods or processes.

DETAILED DESCRIPTION

Various features, advantages, and implementations of the invention may be set forth or be apparent from consideration of the following detailed description, drawings, and claims.

Moreover, it is to be understood that the detailed description and the drawings are exemplary and intended to provide further explanation without limiting the scope of the invention as claimed.

Various known high temperature superconducting ("HTS") materials exist. Scientists have theorized an existence of a "perfect conductor" or a material with extremely low resistance (i.e., resistance similar to that of superconducting materials operating in their superconducting state) that may not exhibit all the other conventionally accepted characteristics of a superconducting material. For purposes of this description, extremely low resistance ("ELR") materials shall generically refer to both superconducting materials, including HTS materials, and perfect conducting materials.

As generally understood, a transition temperature of an ELR material (sometimes also referred to as a critical temperature of such ELR material, including HTS materials) refers to the temperature below which the ELR material "operates" or exhibits (or begins exhibiting) extremely low resistance and/or other phenomenon associated with superconductivity. In other words, the transition temperature corresponds to a temperature at which the ELR material changes or "transitions" between a non-ELR state and an ELR state. As would be appreciated, for many ELR materials, the transition temperature may be a range of temperatures over which the ELR material changes states. As would also be appreciated, the ELR material may have hysteresis in its transition temperature with one transition temperature as the ELR material warms and another transition temperature as the ELR material cools.

Figure 2:
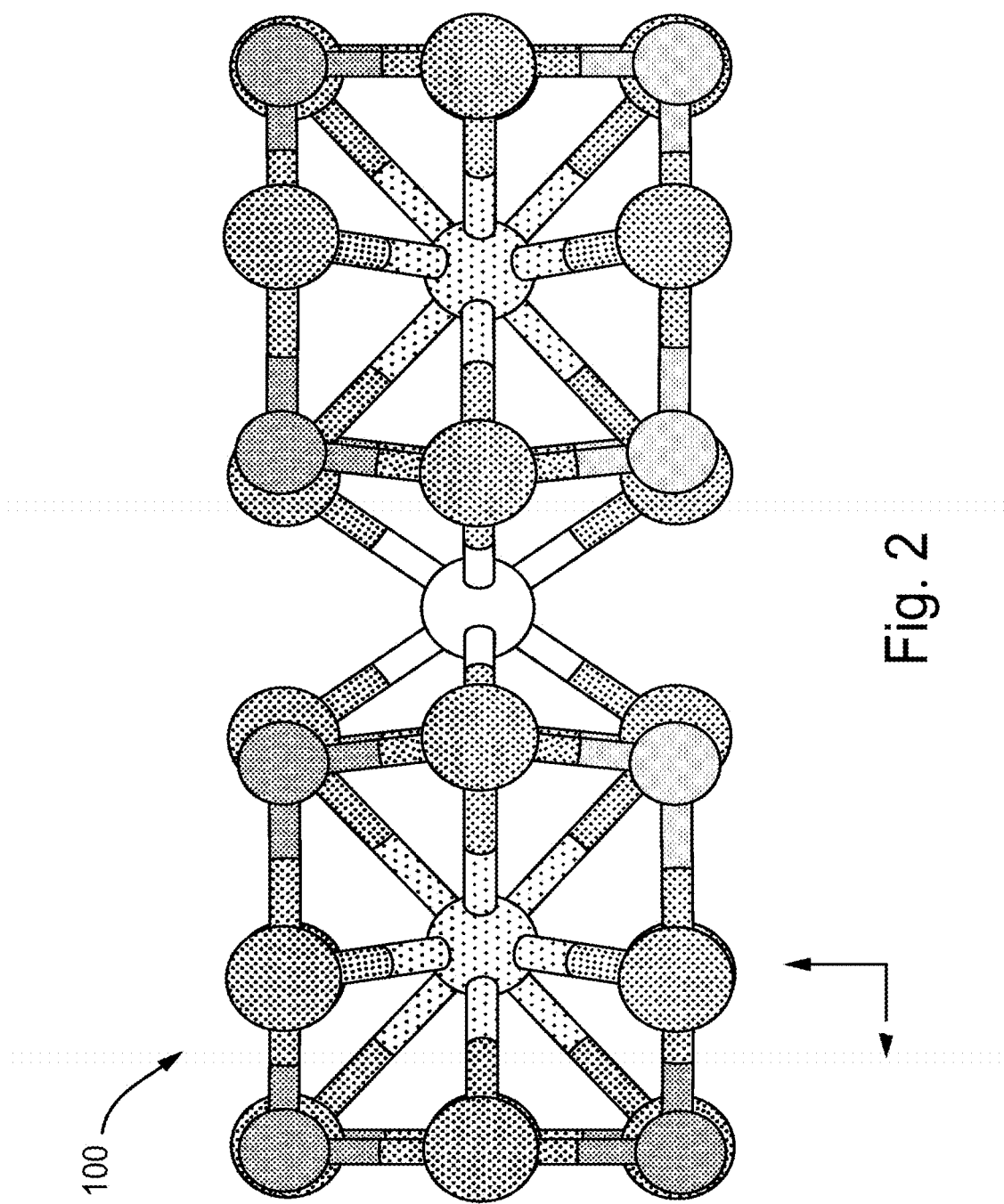
FIG. 2 illustrates a crystalline structure of an exemplary ELR material as viewed from a second perspective.

FIG. 1 illustrates a crystalline structure 100 of an exemplary ELR material as viewed from a first perspective, namely, a perspective perpendicular to an "a-b" face of crystalline structure 100 and parallel to a c-axis thereof. FIG. 2 illustrates crystalline structure 100 as viewed from a second perspective, namely, a perspective perpendicular to an "a-c" face of crystalline structure 100 and parallel to a b-axis thereof. With respect to this exemplary ELR material, the second perspective is similar to a third perspective of crystalline structure 100 which is perpendicular to a "b-c" face of crystalline structure 100 and parallel to an a-axis thereof. For purposes of this description, the exemplary ELR material illustrated in FIG. 1 and FIG. 2 is generally representative of a family of HTS materials known as cuprate-perovskite ceramic materials ("HTS perovskite materials"). The HTS perovskite materials include, but are not limited to, LaBaCuO, LSCO (e.g., $La_{2-x}Sr_xCuO_4$, etc.), YBCO (e.g., $YBa_2Cu_3O_7$, etc.), BSCCO (e.g., $Bi_2Sr_2Ca_2Cu_3O_{10}$, etc.), TBCCO (e.g., $Tl_2Ba_2Ca_2Cu_3O_{10}$ or $Tl_mBa_2Ca_{n-1}Cu_nO_{2n+m+2+s}$), $HgBa_2Ca_2Cu_3O_x$, and other HTS perovskite materials. The other HTS perovskite materials may include, but are not limited to, various substitutions of the cations as would be appreciated. As would also be appreciated, the aforementioned named HTS perovskite materials may refer to generic classes of materials in which many different formulations exist. Many of the HTS perovskite materials have a structure generally similar to (though not necessarily identical to) that of crystalline structure 100.

Studies of some ELR materials demonstrate a directional dependence of the resistance phenomenon (i.e., the phenomenon of extremely low resistance) in relation to crystalline structure 100. HTS perovskite materials predominately exhibit the resistance phenomenon in a direction perpendicular to both the a-c face of crystalline structure 100 (i.e., in a direction parallel to the b-axis) and the b-c face of crystalline structure 100 (i.e., in a direction parallel to the a-axis) and in various combinations thereof (i.e., in directions within the a-b plane). These materials tend not to exhibit the same level of resistance phenomenon in a direction perpendicular to the a-b face of crystalline structure 100 (i.e., in a direction parallel to the c-axis) as compared with other directions. In other words, the resistance phenomenon appears different in the direction of the c-axis. As would be appreciated, various ELR materials exhibit the resistance phenomenon in directions other than or in addition to those described above.

Figure 10:
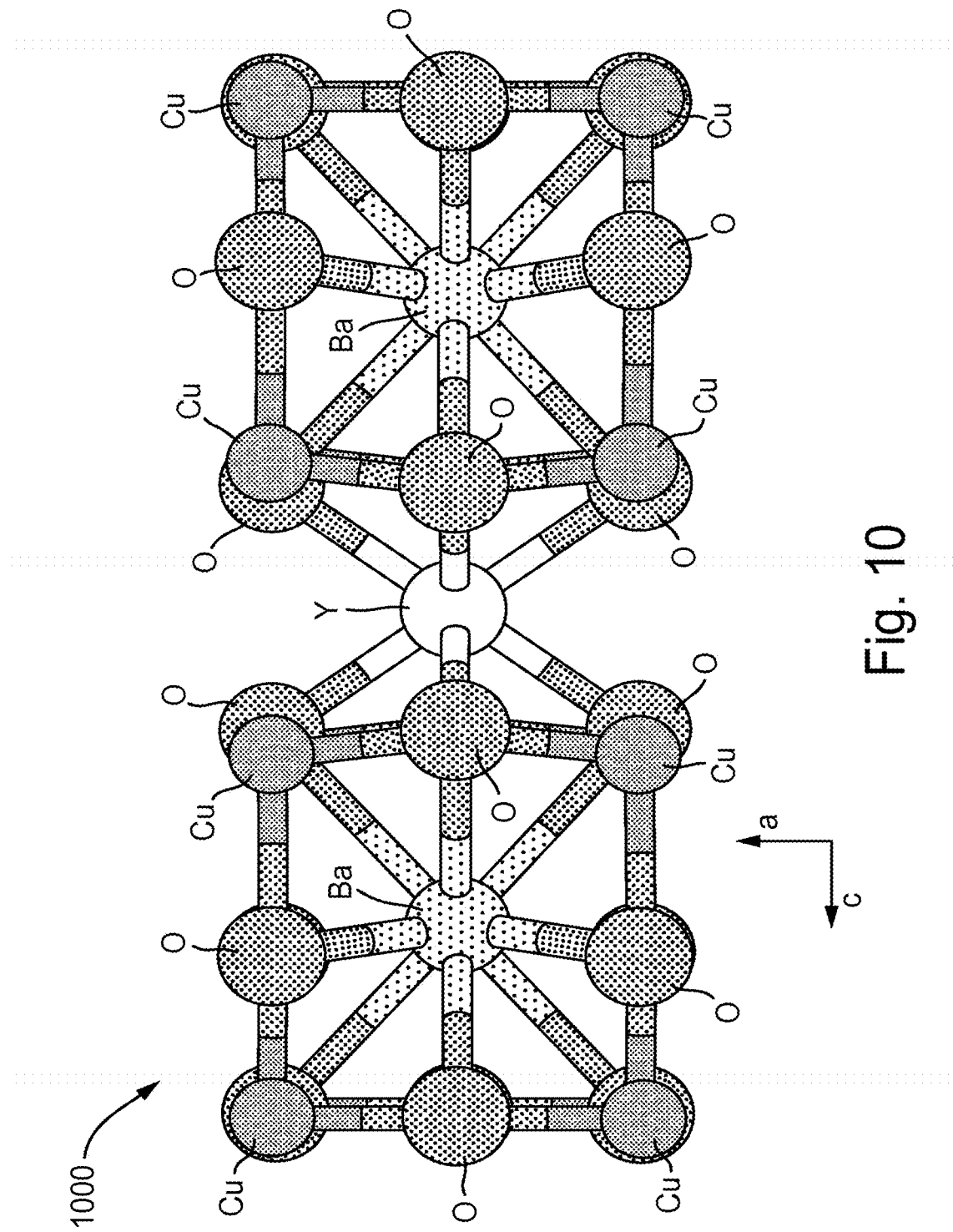
FIG. 10 illustrates a crystalline structure of a unit cell of YBCO as viewed from a second perspective.

In some implementations of the invention, the ELR material corresponds to an HTS perovskite material commonly referred to as "YBCO." YBCO includes various atoms of yttrium ("Y"), barium ("Ba"), copper ("Cu") and oxygen ("O"). By itself, YBCO has a transition temperature of approximately 90K. FIG. 10 illustrates a crystalline structure 1000 of YBCO as would be appreciated. As used herein, YBCO refers to a broad class of yttrium-barium-copper oxide of varying formulations as would be appreciated.

According to various implementations of the invention, various known ELR materials may be modified (thereby producing or creating new ELR material derivations) such that these modified ELR materials operate at higher temperatures than that of the unmodified ELR material. According to various implementations of the invention, various known ELR materials may be modified (thereby producing or creating new ELR material derivations) such that the modified ELR material carries electrical charge in an ELR state at higher temperatures than that of the unmodified ELR material.

In some implementations of the invention, a modifying material is layered onto an ELR material, such as, but not limited to, certain HTS perovskite materials referred to above. In some implementations of the invention, the modifying material corresponds to a class of conductive materials that bonds easily with oxygen ("oxygen bonding conductive materials"). Such oxygen bonding conductive materials include, but are not limited to chromium (Cr), rhodium (Rh), beryllium (Be), gallium (Ga), selenium (Se), and vanadium (V). In some implementations of the invention, the modifying material corresponds to chromium. In some implementations of the invention, the modifying material corresponds to rhodium. In some implementations of the invention, the modifying material corresponds to beryllium. In some implementations of the invention, the modifying material corresponds to gallium. In some implementations of the invention, the modifying material corresponds to selenium. In some implementations of the invention, the modifying material corresponds to vanadium. In some implementations of the invention, other elements may be used as the modifying material. In some implementations of the invention, combinations of different atoms (e.g., compounds, alloys, etc.) may be used as the modifying material. In some implementations of the invention, various layers of atoms and/or combinations of atoms may be used collectively as the modifying material.

In some implementations of the invention, the modifying material is chromium and the ELR material is YBCO. In some implementations of the invention, the modifying material is rhodium and the ELR material is YBCO. In some implementations of the invention, the modifying material is beryllium and the ELR material is YBCO. In some implementations of the invention, the modifying material is gallium and the ELR material is YBCO. In some implementations of the invention, the modifying material is selenium and the ELR material is YBCO. In some implementations of the invention, the modifying material is vanadium and the ELR material is YBCO. In some implementations of the invention, the modifying material is another oxygen bonding conductive material and the ELR material is YBCO.

In some implementations of the invention, various other combinations of HTS perovskite materials and oxygen bonding conductive materials may be used. For example, in some implementations of the invention, the ELR material corresponds to an HTS perovskite material commonly referred to as "BSCCO." BSCCO includes various atoms of bismuth ("Bi"), strontium ("Sr"), calcium ("Ca"), copper ("Cu") and oxygen ("O"). By itself, BSCCO has a transition temperature of approximately 100K. In some implementations of the invention, the modifying material is chromium and the ELR material is BSCCO. In some implementations of the invention, the modifying material is rhodium and the ELR material is BSCCO. In some implementations of the invention, the modifying material is beryllium and the ELR material is BSCCO. In some implementations of the invention, the modifying material is gallium and the ELR material is BSCCO. In some implementations of the invention, the modifying material is selenium and the ELR material is BSCCO. In some implementations of the invention, the modifying material is vanadium and the ELR material is BSCCO. In some implementations of the invention, the modifying material is another oxygen bonding conductive material and the ELR material is BSCCO.

In some implementations of the invention, atoms of the modifying material may be layered onto a sample of the ELR material using various techniques for layering one composition onto another composition. In some implementations of the invention, the ELR material may be layered onto a sample of modifying material using various techniques for layering one composition onto another composition. In some implementations of the invention, a single atomic layer of the modifying material (i.e., a layer of the modifying material having a thickness substantially equal to a single atom of the modifying material) may be layered onto a sample of the ELR material. In some implementations of the invention, the ELR material may be layered onto a single atomic layer of the modifying material. In some implementations of the invention, two or more atomic layers of the modifying material may be layered onto the ELR material. In some implementations of the invention, the ELR material may be layered onto two or more atomic layers of the modifying material.

Figure 3:
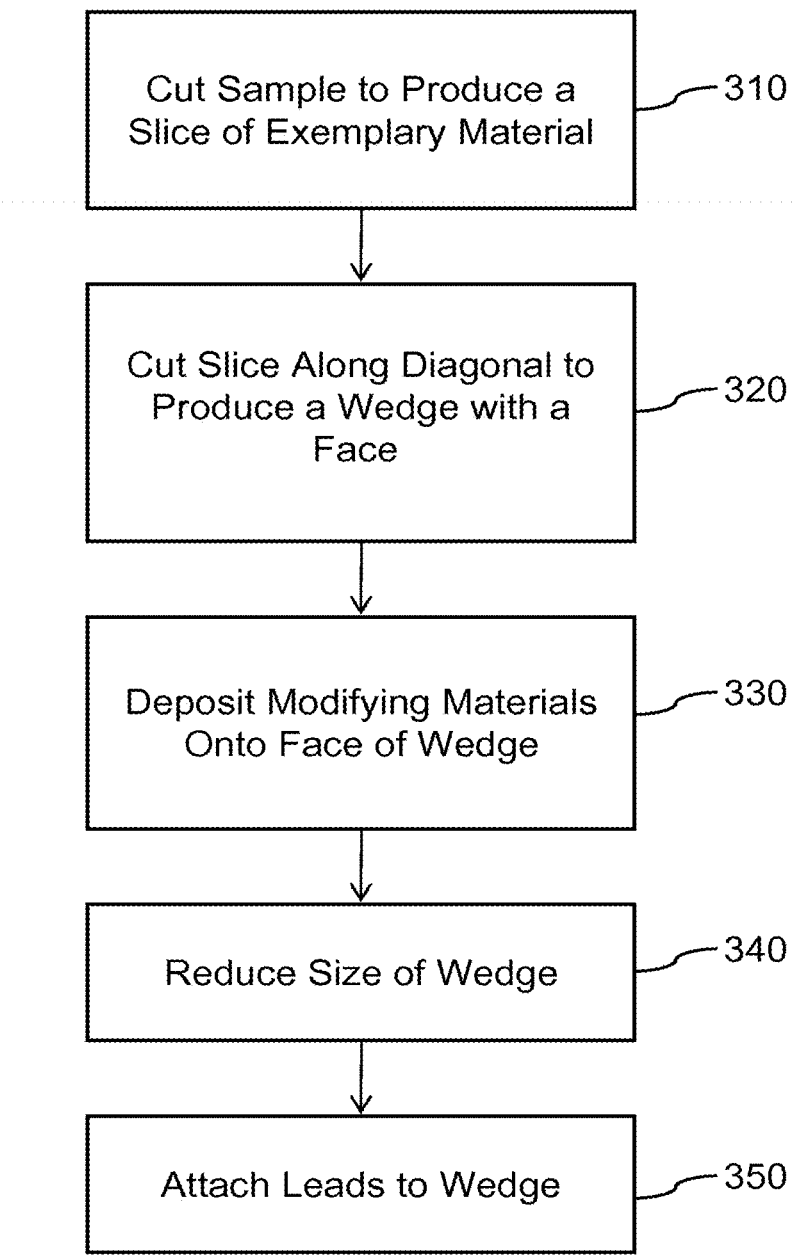
FIG. 3 is a flowchart for producing a modified ELR material from an exemplary ELR material according to various implementations of the invention.

FIGS. 3 and 4A-4I are now used to describe modifying a sample 410 of the ELR material 400 to produce a modified ELR material 460 according to various implementations of the invention. FIG. 3 is a flowchart for modifying sample 410 of the ELR material 400 with a modifying material 480 to produce a modified ELR material 460 according to various implementations of the invention. FIGS. 4A-4I illustrate sample 410 of the ELR material 400 undergoing various modifications to produce modified ELR material 460 according to various implementations of the invention. In some implementations of the invention, the ELR material 400 is a HTS perovskite material and the modifying material 480 is an oxygen bonding conductive material. In some implementations of the invention and for purposes of the following description, the ELR material 400 is YBCO and the modifying material 480 is chromium.

Figure 4A:
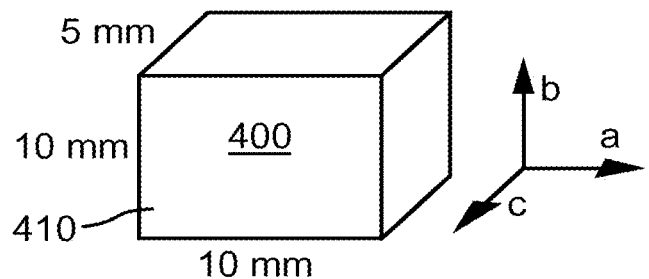
FIGS. 4A-4I illustrate a procedure for preparing a modified ELR material according to various implementations of the invention.

As illustrated in FIG. 4A, sample 410 is a plurality of crystalline unit cells of ELR material 400 which is substantially oriented with its non-conducting axis along the c-axis. In some implementations of the invention, sample 410 has dimensions of approximately 5 mm×10 mm×10 mm. For purposes of this description, sample 410 is oriented so that a primary axis of conduction of exemplary ELR material 400 is aligned along the a-axis. As would be apparent, if exemplary ELR material 400 includes two primary axes of conduction, sample 410 may be oriented along either the a-axis or the b-axis. As would be further appreciated, in some implementations sample 410 may be oriented along any line within the a-b plane.

Figure 4B:
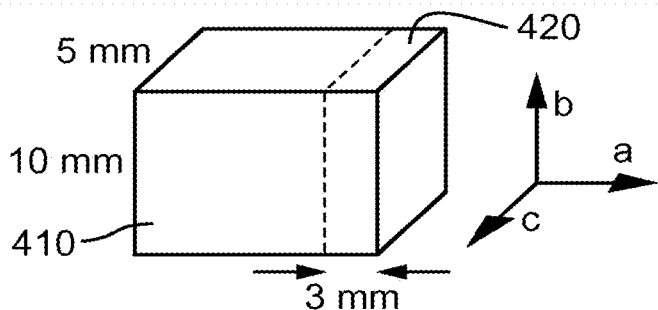
Figure 4C:
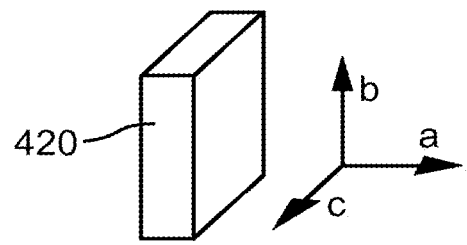

In an operation 310 and as illustrated in FIG. 4B and FIG. 4C, a slice 420 is produced by cutting sample 410 along a plane substantially parallel to the b-c face of sample 410. In some implementations of the invention, slice 420 is approximately 3 mm thick although other thicknesses may be used. In some implementations of the invention, this may be accomplished using a precision diamond blade.

Figure 4D:
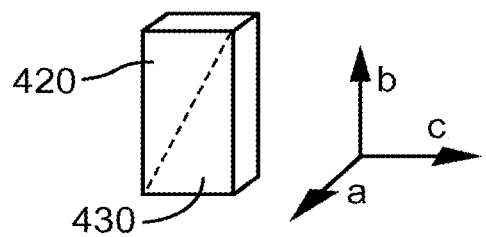
Figure 4E:
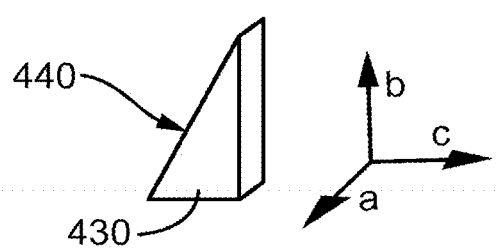
Figure 4F:
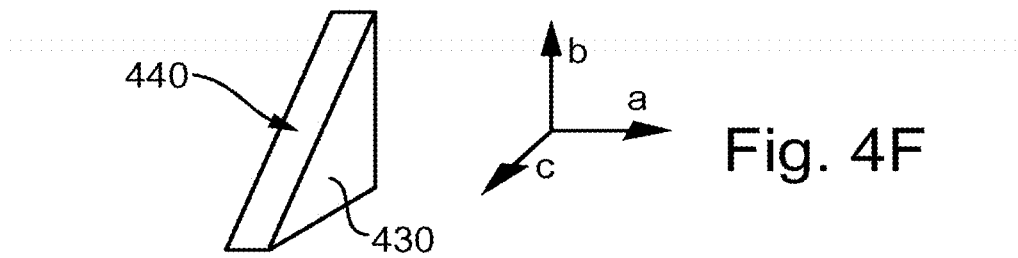

In some implementations of the invention, in an operation 320 and as illustrated in FIG. 4D, FIG. 4E, and FIG. 4F, a wedge 430 is produced by cutting slice 420 along a diagonal of the b-c face of slice 420. In some implementations of the invention, this may be accomplished using a precision diamond blade. This operation produces an exposed face 440 on the diagonal surface of wedge 430. In some implementations of the invention, exposed face 440 corresponds to any plane that is substantially parallel to the c-axis. In some implementations of the invention, exposed face 440 corresponds to a plane substantially perpendicular to the a-axis (i.e., a b-c face of crystalline structure 100). In some implementations of the invention, exposed face 440 corresponds to a plane substantially perpendicular to the b-axis (i.e., an a-c face of crystalline structure 100). In some implementations of the invention, exposed face 440 corresponds to a plane substantially perpendicular to any line in the a-b plane. In some implementations of the invention, exposed face 440 corresponds to any plane that is not substantially perpendicular to the c-axis or other non-conducting axis of the exemplary ELR material 400.

Figure 4G:
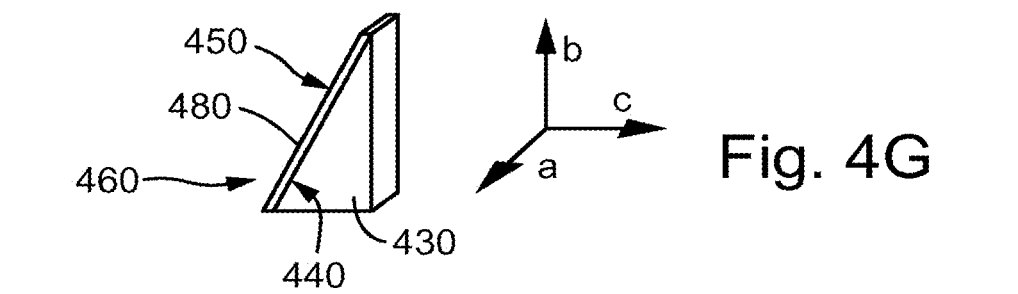

In an operation 330 and as illustrated in FIG. 4G, modifying material 480 is deposited onto exposed face 440 to produce a face 450 of modifying material 480 on wedge 430 and a modified region of ELR material 400 at an interface between diagonal face 440 and modifying material 480. This modified region of ELR material 400 corresponds to a region in wedge 430 proximate to where atoms of modifying material 480 bond to the ELR material 400. Other forms of bonding modifying material 480 to ELR material 400 may be used. Operation 330 is described in further detail below in reference to FIG. 5 in accordance with various implementations of the invention.

Figure 5:
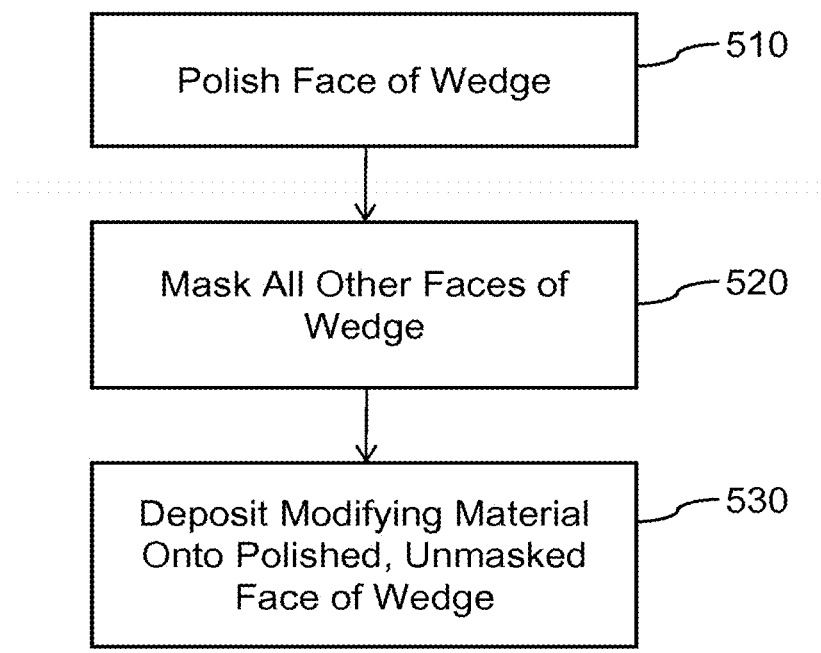
FIG. 5 is a flowchart for depositing a modifying material onto an exemplary ELR material according to various implementations of the invention.

Referring to FIG. 5, in an operation 510, exposed face 440 is polished with a series of water-based colloidal slurries. In some implementations of the invention, exposed face 440 is finally polished with a 20 nm colloidal slurry. In some implementations of the invention, polishing of exposed face 440 is performed in a direction substantially parallel to the a-axis of wedge 430. In an operation 520, one or more surfaces other than exposed face 440 are masked. In some implementations, all surfaces other than exposed face 440 are masked. In an operation 530, modifying material 480 is deposited onto exposed face 440. In some implementations, modifying material 480 is deposited onto exposed face 440 using vapor deposition. In some implementations of the invention, other techniques for depositing modifying material 480 onto exposed face 440 may be used. In some implementations of the invention, approximately 40 nm of modifying material 480 is deposited onto exposed face 440. In some implementations of the invention, modifying material 480 is deposited onto exposed face 440 using vapor deposition under a vacuum of $5 \times 10^{-6}$ torr or less.

Figure 4H:
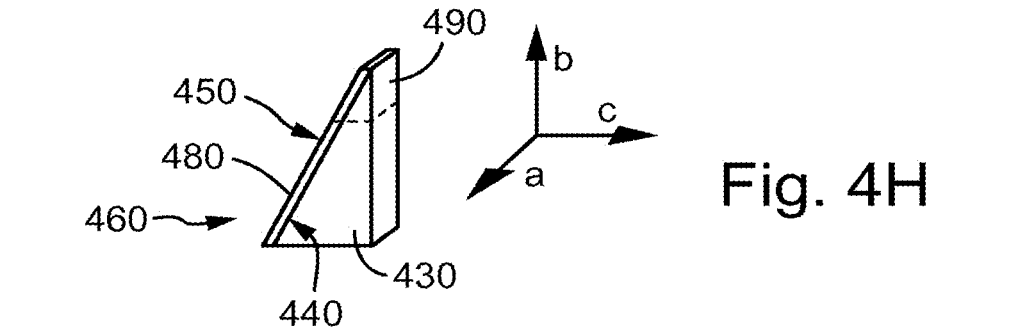
Figure 4I:
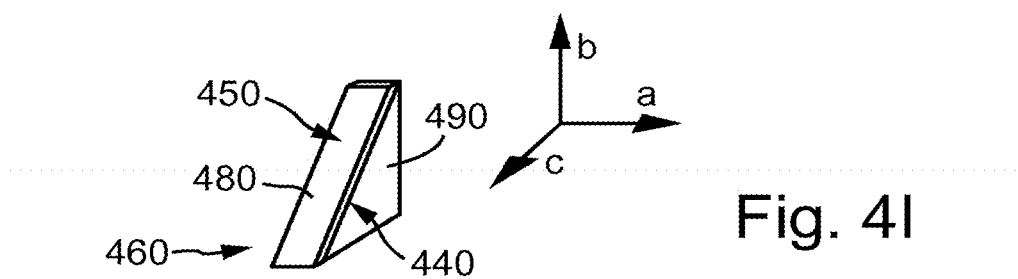

Referring to FIG. 3, FIG. 4H and FIG. 4I, in an operation 340, in some implementations of the invention, a portion of wedge 430 is removed to reduce a size of wedge 430 to produce a reduced wedge 490. In an operation 350, double-ended leads are attached to each of the two b-c faces of reduced wedge 490. In some implementations of the invention, a bonding agent, such as, but not limited to, silver paste (Alfa Aesar silver paste #42469) is used to apply double-ended leads to the two b-c faces of reduced wedge 490. In these implementations, the bonding agent may require curing. For example, the silver paste may be cured for one hour at 60° C. and then cured for an additional hour at 150° C. Other curing protocols may be used as would be apparent. In some implementations of the invention, a conductive material, such as, but not limited to, silver, is sputtered or otherwise bonded onto each of the two b-c faces of reduced wedge 490 and the double-ended leads are attached thereto as would be apparent. Other mechanisms for attaching double-ended leads to reduced wedge 490 may be used.

Figure 6:
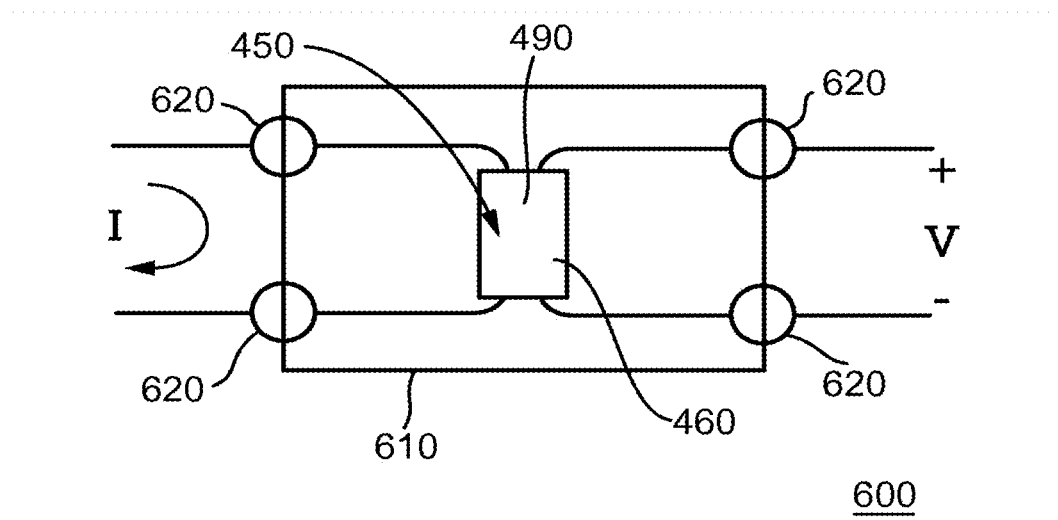
FIG. 6 illustrates a test bed useful for determining various operational characteristics of a modified ELR material according to various implementations of the invention.

FIG. 6 illustrates a test bed 600 useful for determining various operational characteristics of reduced wedge 490. Test bed 600 includes a housing 610 and four clamps 620. Reduced wedge 490 is placed in housing 610 and each of the double-ended leads is clamped to housing 610 using clamps 620 as illustrated. The leads are clamped to housing 610 to provide stress relief in order to prevent flexure and/or fracture of the cured silver paste. A current source is applied to one end of the pair of double-ended leads and a voltmeter measures voltage across the other end of the pair of double-ended leads. This configuration provides a four-point technique for determining resistance of reduced wedge 490, and in particular, of modified ELR material 460 as would be appreciated.

Figure 7A:
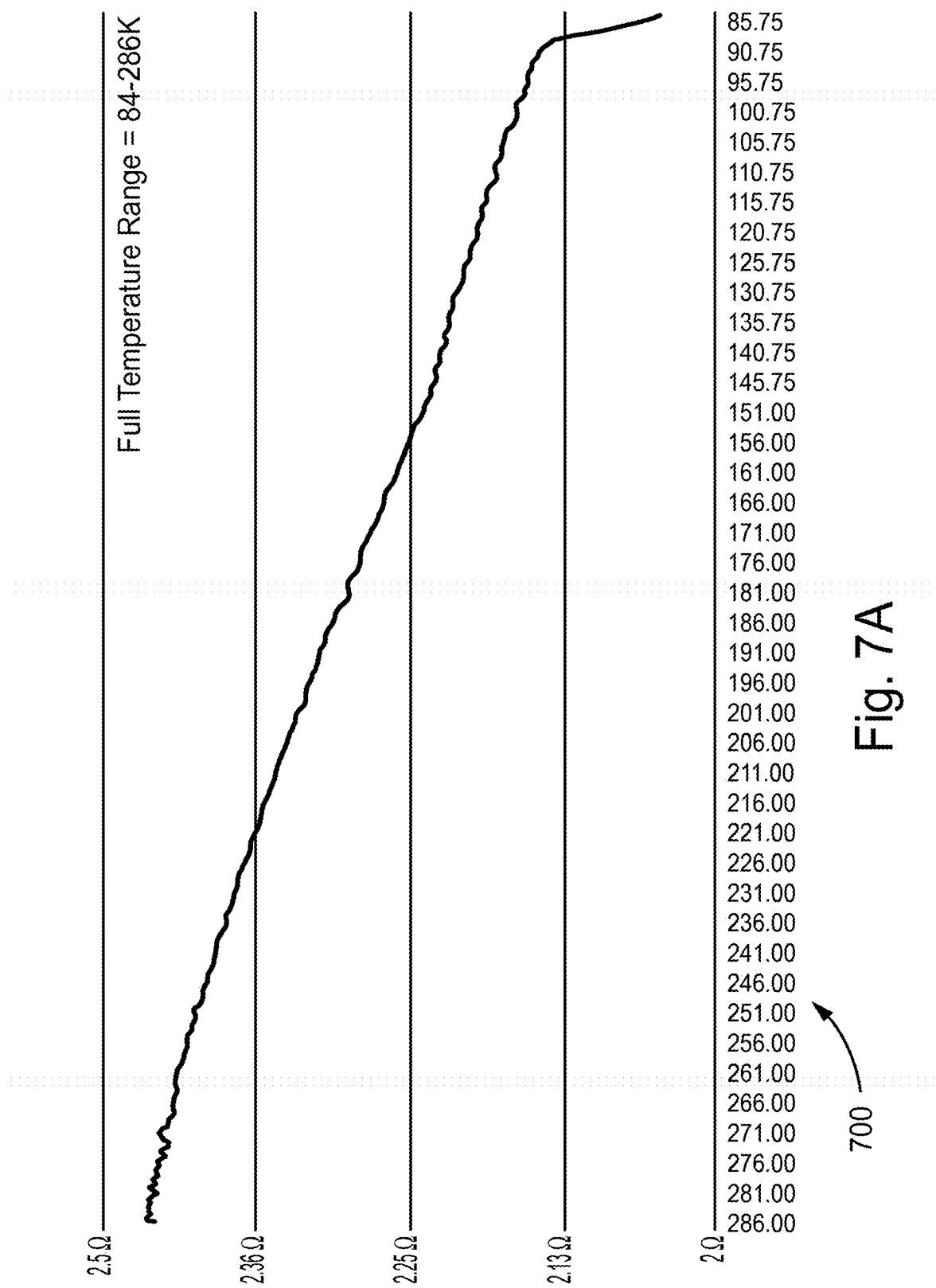
Figure 7B:
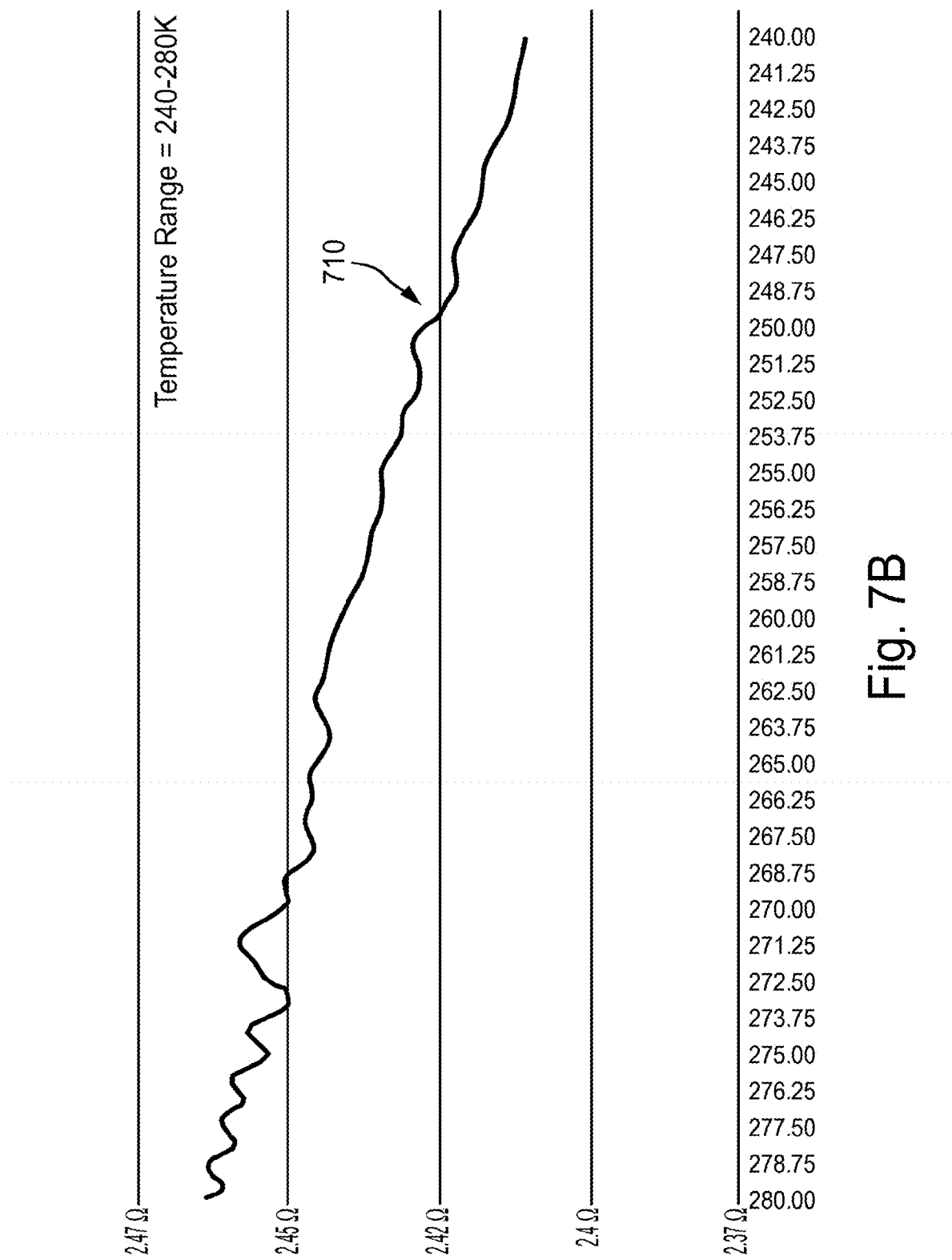
Figure 7C:
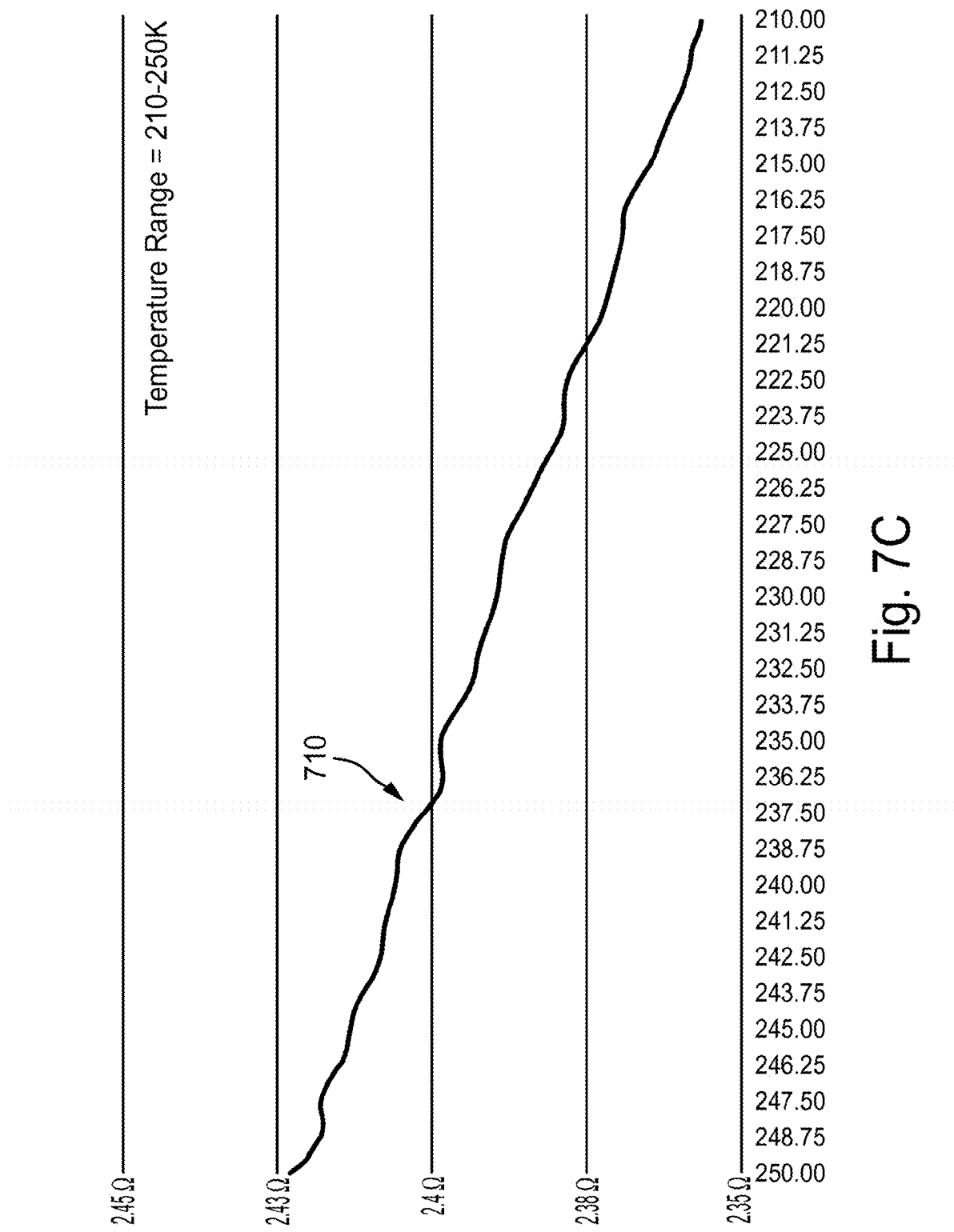
Figure 7D:
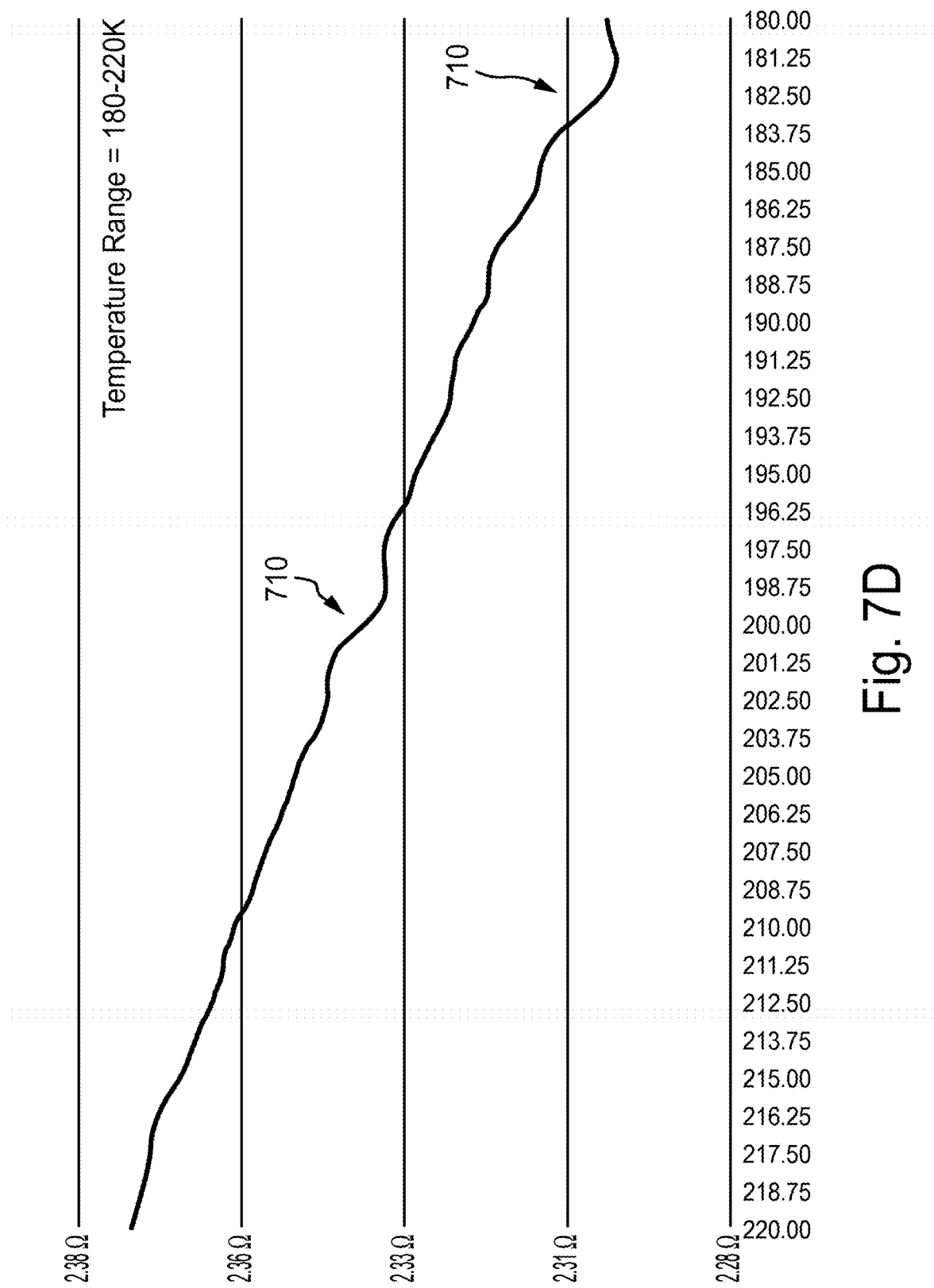
Figure 7F:
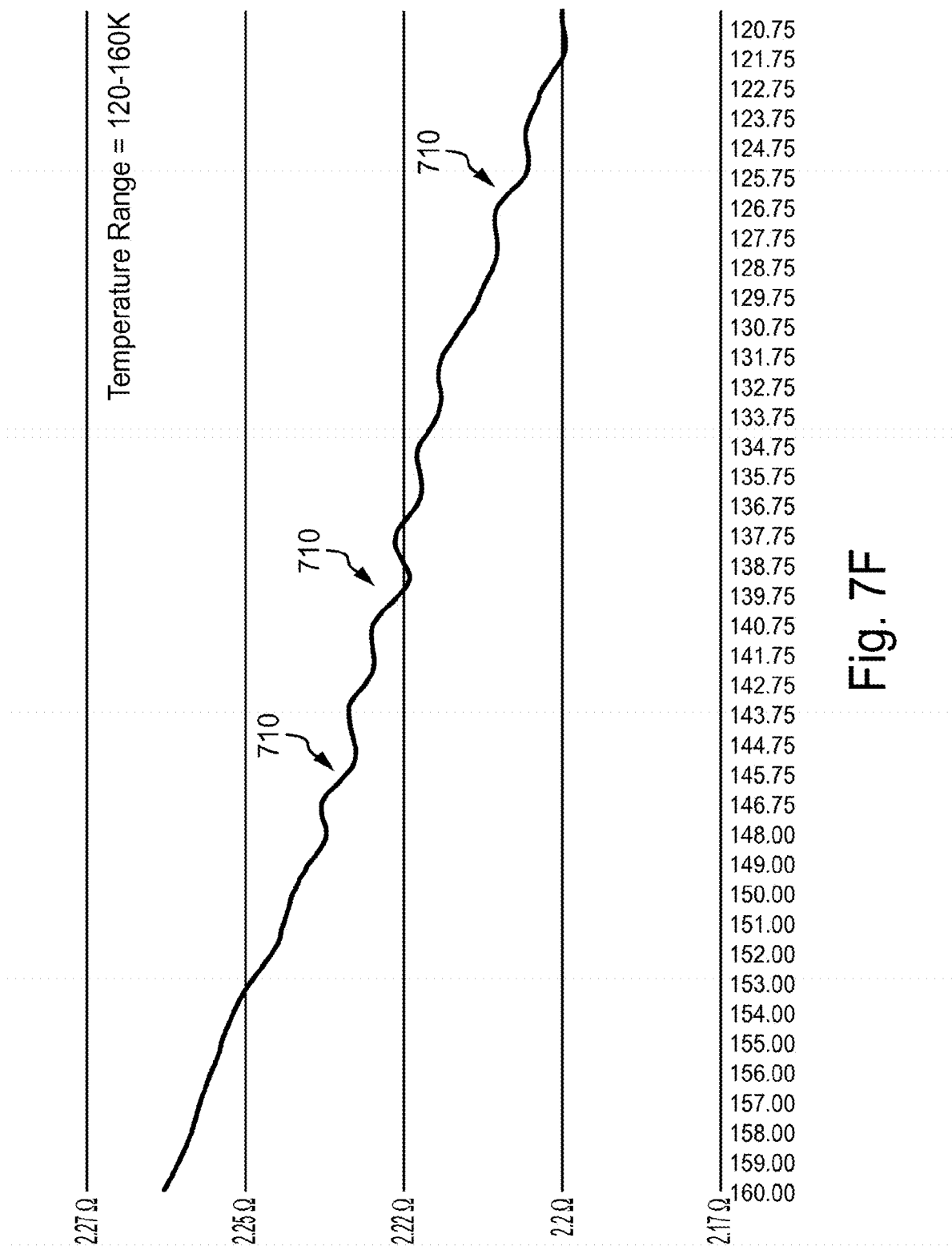
Figure 7G:
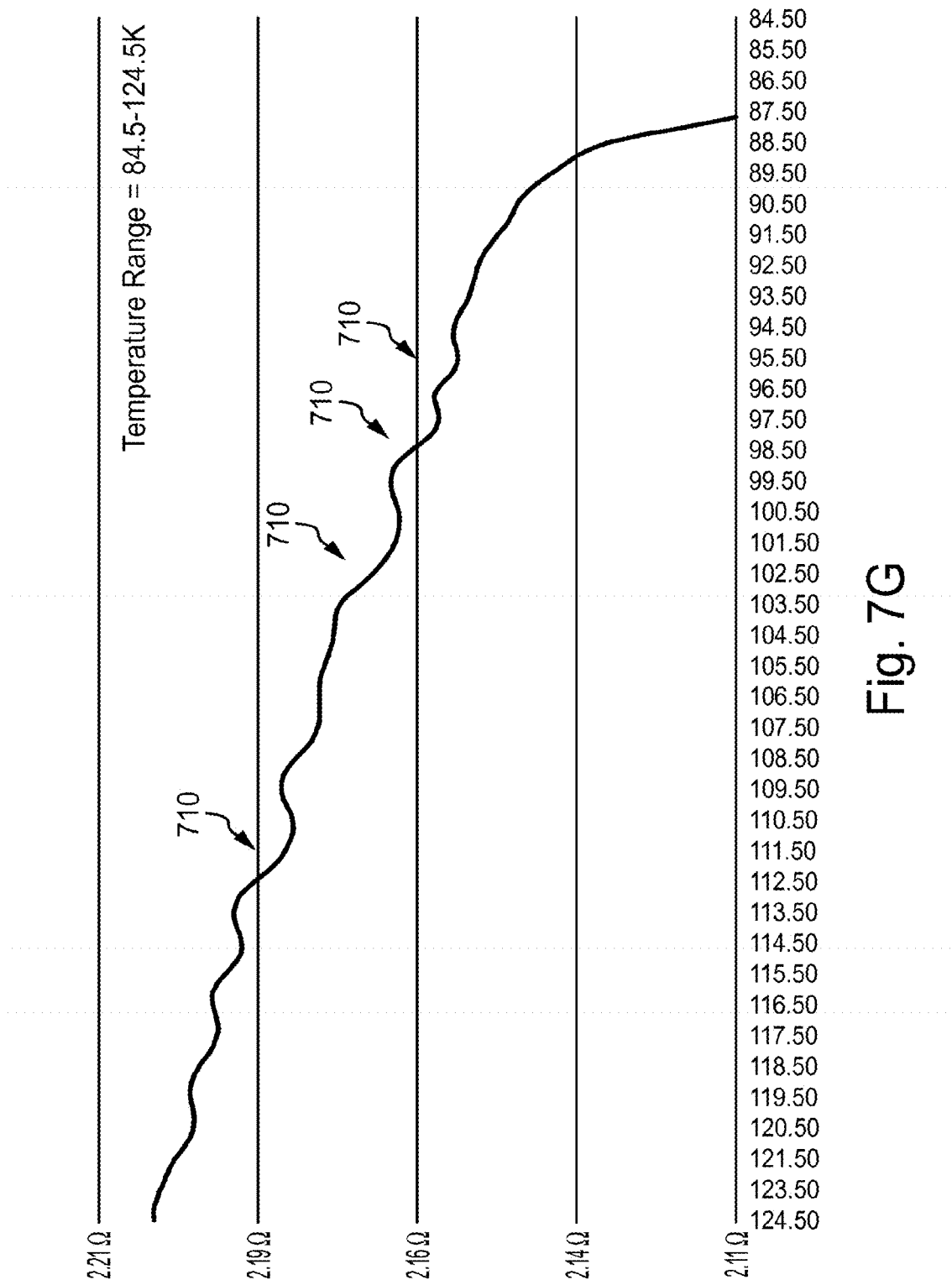

FIGS. 7A-7G illustrate test results 700 obtained as described above. Test results 700 include a plot of resistance of modified ELR material 460 as a function of temperature (in K). FIG. 7A includes test results 700 over a full range of temperature over which resistance of modified ELR material 460 was measured, namely 84K to 286K. In order to provide further detail, test results 700 were broken into various temperature ranges and illustrated. In particular, FIG. 7B illustrates those test results 700 within a temperature range from 240K to 280K; FIG. 7C illustrates those test results 700 within a temperature range from 210K to 250K; FIG. 7D illustrates those test results 700 within a temperature range from 180K to 220K; FIG. 7E illustrates those test results 700 within a temperature range from 150K to 190K; FIG. 7F illustrates those test results 700 within a temperature range from 120K to 160K; and FIG. 7G illustrates those test results 700 within a temperature range from 84.5K to 124.5K.

Test results 700 demonstrate that various portions of modified ELR material 460 within reduced wedge 490 operate in an ELR state at higher temperatures relative to exemplary ELR material 400. Six sample analysis test runs were made using reduced wedge 490. For each sample analysis test run, test bed 610, with reduced wedge 490 mounted therein, was slowly cooled from approximately 286K to 83K. While being cooled, the current source applied +60 nA and −60 nA of current in a delta mode configuration through reduced wedge 490 in order to reduce impact of any DC offsets and/or thermocouple effects. At regular time intervals, the voltage across reduced wedge 490 was measured by the voltmeter. For each sample analysis test run, the time series of voltage measurements were filtered using a 512-point FFT. All but the lowest 44 frequencies from the FFT were eliminated from the data and the filtered data was returned to the time domain. The filtered data from each sample analysis test run were then merged together to produce test results 700. More particularly, in a process commonly referred to as "binning," all the resistance measurements from the six sample analysis test runs were organized into a series of temperature ranges (e.g., 80K-80.25K, 80.25K to 80.50, 80.5K to 80.75K, etc.). Then the resistance measurements in each temperature range were averaged together to provide an average resistance measurement for each temperature range. These average resistance measurements form test results 700.

Test results 700 include various discrete steps 710 in the resistance versus temperature plot, each of such discrete steps 710 representing a relatively rapid change in resistance over a relatively narrow range of temperatures. At each of these discrete steps 710, discrete portions or fractions of modified ELR material 460 begin carrying electrical charges up to such portions' charge carrying capacity at the respective temperatures.

Before discussing test results 700 in further detail, various characteristics of exemplary ELR material 400 and modifying material 480 are discussed. Resistance versus temperature ("R-T") profiles of these materials individually are generally well known. The individual R-T profiles of exemplary ELR material 400 and modifying material 480 individually are not believed to include changes similar to discrete steps 710 found in test results 700. Accordingly, discrete steps 710 are the result of modifying ELR material 400 with modifying material 480 to thereby cause the modified material to remain in an ELR state at increased temperatures in accordance with various implementations of the invention.

Test results 700 indicate that certain portions (i.e., fractions) of modified ELR material 460 begin carrying electrical charge at approximately 97K. Test results 700 also indicate that: certain portions of modified ELR material 460 begin carrying electrical charge at approximately 100K; certain portions of modified ELR material 460 begin carrying electrical charge at approximately 103K; certain portions of modified ELR material 460 begin carrying electrical charge at approximately 113K; certain portions of modified ELR material 460 begin carrying electrical charge at approximately 126K; certain portions of modified ELR material 460 begin carrying electrical charge at approximately 140K; certain portions of modified ELR material 460 begin carrying electrical charge at approximately 146K; certain portions of modified ELR material 460 begin carrying electrical charge at approximately 179K; certain portions of modified ELR material 460 begin carrying electrical charge at approximately 183.5K; certain portions of modified ELR material 460 begin carrying electrical charge at approximately 200.5K; certain portions of modified ELR material 460 begin carrying electrical charge at approximately 237.5K; and certain portions of modified ELR material 460 begin carrying electrical charge at approximately 250K. Certain portions of modified ELR material 460 may begin carrying electrical charge at other temperatures within the full temperature range as would be appreciated.

Test results 700 include various other relatively rapid changes in resistance over a relatively narrow range of temperatures not otherwise identified as a discrete step 710. Some of these other changes may correspond to artifacts from data processing techniques used on the measurements obtained during the test runs (e.g., FFTs, filtering, etc.). Some of these other changes may correspond to additional discrete steps 710. In addition, changes in resistance in the temperature range of 270-274K may be associated with water present in modified ELR material 460, some of which may have been introduced during preparation of reduced wedge 490, for example, but not limited to, during operation 510.

In addition to discrete steps 710, test results 700 differ from the R-T profile of exemplary ELR material 400 in that modifying material 480 conducts well at temperatures above the transition temperature of exemplary ELR material 400 whereas exemplary ELR material 400 typically does not.

Figure 8:
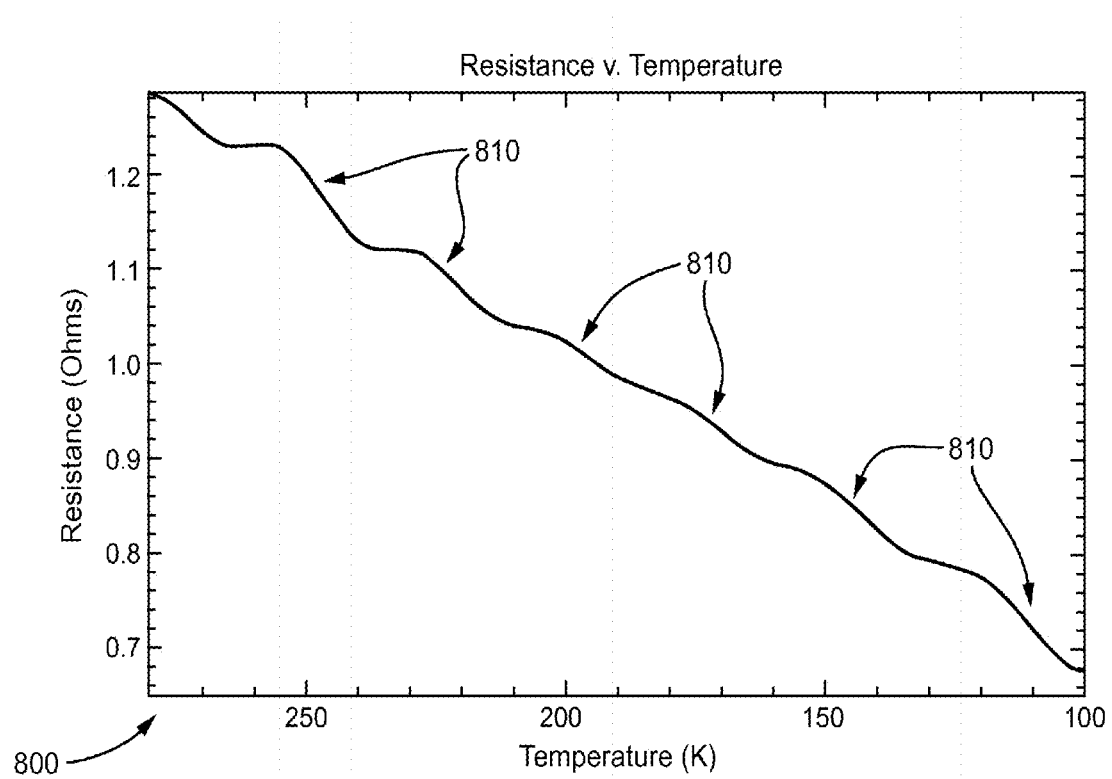
FIG. 8 illustrates a second set of test results demonstrating various operational characteristics of a modified ELR material according to various implementations of the invention.

FIG. 8 illustrates additional test results 800 for samples of exemplary ELR material 400 and modifying material 480 similar to those discussed above. Test results 800 include a plot of resistance of modified ELR material 460 as a function of temperature (in K). FIG. 8 includes test results 800 over a full range of temperature over which resistance of modified ELR material 460 was measured, namely 80K to 275K. Test results 800 demonstrate that various portions of modified ELR material 460 operate in an ELR state at higher temperatures relative to exemplary ELR material 400. Five sample analysis test runs were made with a sample of modified ELR material 460. For each sample analysis test run, test bed 610, with a sample of modified ELR material 460 mounted therein, was slowly warmed from approximately 80K to 275K. While being warmed, the current source applied +10 nA and −10 nA of current in a delta mode configuration through the sample in order to reduce impact of any DC offsets and/or thermocouple effects. At regular time intervals (which in this case was 24 samples per minute), the voltage across the sample of modified ELR material 460 was measured by the voltmeter. For each sample analysis test run, the time series of voltage measurements were filtered using a 1024-point FFT. All but the lowest 15 frequencies from the FFT were eliminated from the data and the filtered data was returned to the time domain. The filtered data from each sample analysis test run were then merged together to produce test results 800. More particularly, all the resistance measurements from the five sample analysis test runs were organized into a series of temperature ranges (e.g., 80K to 80.25K, 80.25K to 80.50, 80.5K to 80.75K, etc.). Then the resistance measurements in each temperature range were averaged together to provide an average resistance measurement for each temperature range. These average resistance measurements form test results 800.

Test results 800 include various discrete steps 810 in the resistance versus temperature plot, each of such discrete steps 810 representing a relatively rapid change in resistance over a relatively narrow range of temperatures, similar to discrete steps 710 discussed above with respect to FIGS. 7A-7G. At each of these discrete steps 810, discrete portions or fractions of modified ELR material 460 begin carrying electrical charges up to such portions' charge carrying capacity at the respective temperatures.

Test results 800 indicate that certain portions of modified ELR material 460 begin carrying electrical charge at approximately 120K. Test results 800 also indicate that: certain portions of modified ELR material 460 begin carrying electrical charge at approximately 145K; certain portions of modified ELR material 460 begin carrying electrical charge at approximately 175K; certain portions of modified ELR material 460 begin carrying electrical charge at approximately 200K; certain portions of modified ELR material 460 begin carrying electrical charge at approximately 225K; and certain portions of modified ELR material 460 begin carrying electrical charge at approximately 250K. Certain portions of modified ELR material 460 may begin carrying electrical charge at other temperatures within the full temperature range as would be appreciated.

Figure 9:
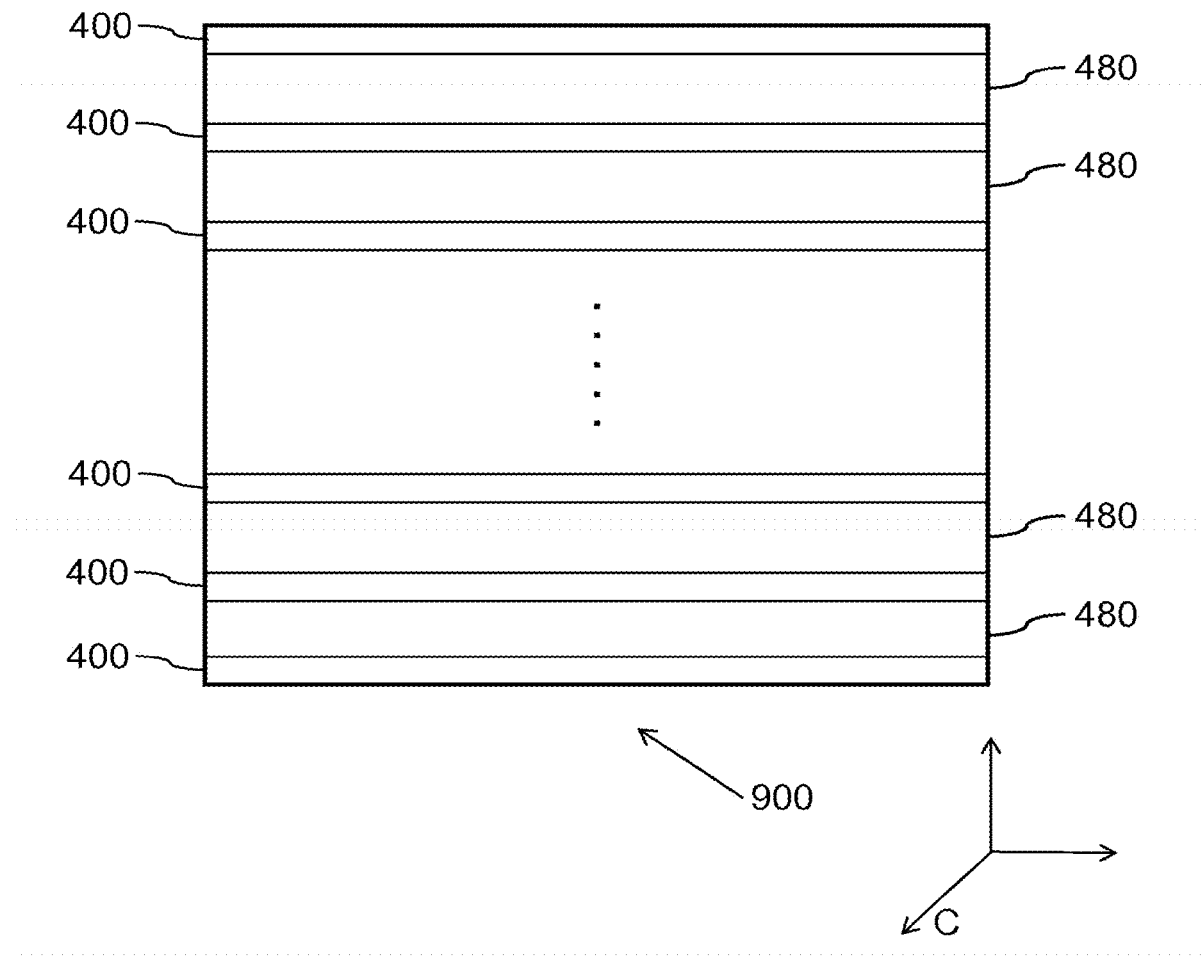
FIG. 9 illustrates an arrangement of an exemplary ELR material and a modifying material useful for operating at higher temperatures and/or for carrying additional charge according to various implementations of the invention.

FIG. 9 illustrates an arrangement 900 including alternating layers of exemplary ELR material 400 and a modifying material 480 useful for carrying additional electrical charge according to various implementations of the invention. Such layers may be formed onto one another using various techniques, including various deposition techniques. Arrangement 900 provides increased surface area between the ELR material 400 and the modifying material 480 thereby increasing a charge carrying capacity of arrangement 900.

In some implementations of the invention, any number of layers may be used. In some implementations of the invention, other ELR materials and/or other modifying materials may be used. In some implementations of the invention, additional layers of other material (e.g., insulators, conductors, or other materials) may be used between paired layers of the ELR material 400 and modifying material 480 to mitigate various effects (e.g., Meissner effect, migration of materials, or other effects) or to enhance the characteristics of the modified ELR material 460 formed within such paired layers. In some implementations of the invention, not all layers are paired. In other words, arrangement 900 may have one or more extra (i.e., unpaired) layers of ELR material 400 or one or more extra layers of modifying material 480.

In some implementations of the invention, each layer of modifying material 480 is one or more atomic layers thick. In some implementations of the invention, each layer of modifying material 480 is several atomic layers thick. In some implementations of the invention, each layer of the ELR material 400 is one or more crystalline unit cells thick. In some implementations of the invention, each layer of the ELR material 400 is several crystalline unit cells thick. In some implementations of the invention, layers of the modifying material 480 are thicker than layers of the ELR material 400. In some implementations of the invention, layers of the modifying material 480 are thinner than layers of the ELR material 400. In some implementations of the invention, layers of the modifying material 480 have a thickness that is substantially the same as a thickness of the ELR material 400.

In some implementations of the invention, various deposition techniques, including, but not limited to, ion beam assisted deposition, molecular beam epitaxy, atomic layer deposition, pulse laser deposition, or other deposition techniques, may be used, some of which may be used to improve alignment of crystalline unit cells within layers of ELR material 400 as would be appreciated.

In some implementations of the invention, bonding, including layering or depositing, a modifying material 480 to an ELR material 400 does not including "doping" the ELR material 400 with the modifying material 480.

Although the foregoing description is directed toward various implementations of the invention, it is noted that other variations and modifications will be apparent to those skilled in the art, and may be made without departing from the spirit or scope of the invention. Moreover, various features described in connection with one implementation of the invention may be used in conjunction or combination with various other features or other implementations described herein, even if not expressly stated above.

What is claimed is:

1. A composition comprising:
a first layer comprising an HTS perovskite material; and
a second layer comprising a modifying material, wherein the modifying material of the second layer is bonded to a face of the HTS perovskite material of the first layer, wherein the face is substantially perpendicular to an a-axis or a b-axis of the HTS perovskite material, wherein the modifying material comprises an element selected from the group consisting of: chromium, rhodium, beryllium, gallium, selenium, and vanadium.

2. The composition of claim 1, wherein the composition has improved operating characteristics over those of the HTS perovskite material.

3. The composition of claim 2, wherein the composition operates at a higher temperature than that of the HTS perovskite material.

4. The composition of claim 3, wherein the composition demonstrates extremely low resistance at a higher temperature than that of the HTS perovskite material.

5. The composition of claim 3, wherein the composition transitions from a non-ELR state to a ELR state at a temperature higher than that of the HTS perovskite material.

6. The composition of claim 1, wherein the HTS perovskite material is YBCO.

7. The composition of claim 1, wherein the modifying material of the second layer is bonded to a face of the HTS perovskite material of the first layer, wherein the face is substantially perpendicular to a b-axis of the HTS perovskite material.

8. The composition of claim 1, wherein the modifying material of the second layer is bonded to a face of the HTS perovskite material of the first layer, wherein the face is substantially perpendicular to an a-axis of the HTS perovskite material.

9. The composition of claim 1, wherein the modifying material of the second layer is bonded to a face of the HTS perovskite material of the first layer, wherein the face is substantially parallel to the c-axis.

10. The composition of claim 1, wherein the composition has a transition temperature greater than that of the HTS perovskite material.

11. The composition of claim 1, wherein the composition carries a greater amount of current in an ELR state than that carried by the HTS perovskite material in its ELR state.

12. A method comprising:
bonding a modifying material to a face of a HTS perovskite material, wherein the face of the HTS perovskite material is substantially perpendicular to an a-axis or a b-axis of the HTS perovskite material, wherein the modifying material comprises an element selected from the group consisting of: chromium, rhodium, beryllium, gallium, selenium, and vanadium.

13. The method of claim 12, wherein bonding a modifying material to a face of HTS perovskite material comprises depositing the modifying material onto the HTS perovskite material.

14. The method of claim 12, wherein bonding a modifying material to a face of HTS perovskite material comprises forming the HTS perovskite material onto the modifying material.

15. A composition comprising:
a first layer comprising an HTS perovskite material material;
a second layer comprising a modifying material, wherein the second layer is bonded to a face of the first layer, wherein the face of the HTS perovskite material is substantially perpendicular to an a-axis or a b-axis of the HTS perovskite material;
a third layer comprising the HTS perovskite material; and
a fourth layer of the modifying material, wherein the fourth layer is bonded to the third layer.

16. The composition of claim 15, wherein the fourth layer is bonded to a face of the HTS perovskite material of the third layer, wherein the face of the HTS perovskite material of the third layer is substantially perpendicular to the a-axis or the b-axis of the HTS perovskite material.

17. The composition of claim 15, wherein the HTS perovskite material is YBCO.

* * * * *